United States Patent
Apeldoorn et al.

(10) Patent No.: US 6,812,772 B2
(45) Date of Patent: Nov. 2, 2004

(54) METHOD FOR DRIVING A POWER SEMICONDUCTOR

(75) Inventors: Oscar Apeldoorn, Bettwil (CH); Eric Carroll, Leutwil (CH); Peter Streit, Widen (CH); André Weber, Olten (CH)

(73) Assignee: ABB Schweiz AG, Baden (CH)

( * ) Notice: Subject to any disclaimer, the term of this patent is extended or adjusted under 35 U.S.C. 154(b) by 27 days.

(21) Appl. No.: 10/246,407

(22) Filed: Sep. 19, 2002

(65) Prior Publication Data

US 2003/0067342 A1 Apr. 10, 2003

(30) Foreign Application Priority Data

Sep. 28, 2001 (EP) ............................. 01810952

(51) Int. Cl.$^7$ .............................................. H03K 17/72
(52) U.S. Cl. ...................................................... 327/440
(58) Field of Search ............................... 327/440, 442, 327/467; 257/119, 138, 145

(56) References Cited

U.S. PATENT DOCUMENTS

| | | | |
|---|---|---|---|
| 4,129,809 A | * 12/1978 | Rosa | 318/293 |
| 4,208,711 A | * 6/1980 | Baker | 363/136 |
| 5,144,401 A | 9/1992 | Ogura et al. | |
| 5,150,271 A | * 9/1992 | Unterweger et al. | 361/91 |
| 6,188,267 B1 | * 2/2001 | Sanchez et al. | 327/438 |

OTHER PUBLICATIONS

S. Eicher et al., "The 10 kV IGCT—A New Device For Medium Voltage Drives", ABB publication 2000.
Dr. Peter K. Steimer et al., "IGCT—A New, Emerging Technology For High–Power, Low–Cost Inverters", ABB publication 1998.
Ogura, et al., "High–Frequency 6000-V Double–Gate GTO's", IEEE Transactions on Electron Devices, vol. 40 (1993) Mar., No. 3, New York, U.S.A..

* cited by examiner

*Primary Examiner*—Kenneth B. Wells
(74) *Attorney, Agent, or Firm*—Burns, Doane, Swecker & Mathis, L.L.P.

(57) ABSTRACT

The integrated gate dual transistor (IGDT) has two controllable gates (G1, G2), a first gate (G1) being provided on the cathode side and being driven via a low-inductance first gate terminal with a first gate current, and a second gate (G2) being provided on the anode side and being driven via a low-inductance second gate terminal with a second gate current. In the switch-off operation of the IGDT, the rate of rise of the voltage across the IGDT is limited via the two gates. Limiting the rate of rise of the voltage across the IGDT prevents voltages from building up at different speeds in a series circuit of IGDTs, and thus unequal loads from overheating and destroying the individual IGDTs.

11 Claims, 5 Drawing Sheets

METHOD FOR DRIVING A POWER SEMICONDUCTOR

FIELD OF THE INVENTION

The invention concerns the field of high-power electronics.

It relates to a method for driving a power semiconductor element, the power semiconductor element being an integrated gate dual transistor (GDT) having two controllable gates, a first gate being provided on the cathode side and being driven via a low-inductance first gate terminal with a first gate current, and a second gate being provided on the anode side and being driven via a low-inductance second gate terminal with a second gate current.

It further relates to a circuit arrangement for carrying out this method.

BACKGROUND OF THE INVENTION

In the field of power electronics, the search for the optimal turn-off semiconductor element has produced various fast, powerful semiconductor elements. To achieve even larger switched powers it is necessary to reduce losses for the semiconductor elements that are becoming ever smaller. Both dynamic switching losses and steady-state conducting or blocking losses lead to high temperatures and limit switching power and frequency.

The Gate Turn-Off thyristor (GTO) is a turn-off semiconductor element—known for a number of years—with a characteristic recovery time and a turn-off gain of greater than 1. For turn-off, a turn-off command in the form of a positive current is applied to a cathodal gate of the GTO. The gate current is controlled by a gate driver. The recovery or reaction time between the turn-off command and the actual turn-off process is a multiple of the actual switching duration and depends both on the present operating state, in particular on the current intensity to be switched, and on the gate driver. This makes, in particular, snubberless turn-off of GTOs impossible, and connection in series and connection in parallel very complicated.

The dual gate GTO, as is described in Tsuneo Ogura et al., "*High-Frequency 6000V Double Gate GTOs*"1993, *IEEE Transactions on Electron Devices*, Vol 40. No. 3, has an additional gate on the anode side in comparison with the normal GTO, which results in the possibility of initiating the turn-off operation by means of a respective gate driver on both sides of the element. The advantage of the significantly reduced turn-off losses is opposed here by the significantly more complicated gate driver. This is because if the GTO already has considerable reaction times dependent on the operating state, it is not surprising that the dual gate GTO reacts in an even more complex manner. On the cathode side and on the anode side, significantly different recovery times result which are in turn dependent on the respective operating state and also on the two gate drivers. Thus, the switching of a dual gate GTO is not just necessarily associated with delays, it also requires an extremely precise timing, dependent on the operating state, between the two gate drivers. The time pattern for the driving of a dual gate GTO is thus much more complex than for a normal GTO. For this reason, the dual gate GTO has not gained acceptance in practice, even though it has been known for more than 10 years and could potentially have considerable advantages.

The Integrated Gate-Commutated Thyristor (IGCT), as is described in S. Eicher et al., "*The 10 kV IGCT—A New Device for Medium Voltage Drives*", *IEEE-IAS* 2000, is a further turn-off semiconductor element with a turn-off gain of less than or equal to 1 and a very short reaction time. The IGCT is a "hard" driven trench GTO. The concept of "hard" driving is based on a new type of gate driver and a very low-inductance gate connection to the active part. This results in a series of significant advantages, in particular an extremely short switching delay time, the possibility of the snubberless circuit and also the improved possibility of the series circuit. Compared with the GTO, it is additionally possible to increase the switching power, generally up to a fixed specific switching power per area. As a result, the complicated scaling rules of the GTO are also obviated. Moreover, as a result of homogeneously obtained specific switching power per area, the IGCT avoids local overheating and thus a thermal instability. The terms and concepts "hard-driven" and "hard-control" were disclosed, for example, in an article entitled "*IGCT—A New Emerging Technology For High-Power, Low-Cost Inverters*", authored by Peter K. Steimer, et al, and published in ABB Review, pages 34–42, May 1998.

SUMMARY OF THE INVENTION

The object of the present invention is to provide a method for driving an integrated gate dual transistor (IGDT) which is tailored to the properties of the IGDT and thus allows optimal operation of the IGDT, and also of providing a circuit arrangement for carrying out this method.

The object is achieved by means of a method having the features of patent claim 1 and a circuit arrangement having the features of patent claims 7 or 8.

Driven according to the method according to the invention, the strengths of the IGDT can be utilized optimally.

With hard driving of in each case one or both gates, it is possible to minimize switching losses as a result of fast switching and as a result of reduction of the tail current.

In particular in the case of the turn-off operation of the IGDT, the hard driving of the anodal gate leads to a considerable reduction of the turn-off losses in comparison with the conventional IGCT, it being possible to use, in particular, other settings of the lifetime of the charge carriers (lifetime control techniques).

The optimization of lifetime control combined with the high-gain anode structure enables the on-state losses of the IGDT to be reduced by 20 to 50% compared with conventional IGCTs.

Through simultaneous reduction of switching and on-state losses, it is possible to design the IGDT for higher voltages (10 kV) than the conventional IGCT (6 kV).

By limiting the rate of rise of the voltage across the IGDT via the two gates in the switch-off operation of the IGDT, and/or by controlling the reverse current between anode and cathode via the two gates in the switched-off state of the IGDT, the use of the IGDT in series circuits is facilitated.

Limiting the rate of rise of the voltage across the IGDT prevents voltages from building up at different speeds in a series circuit of IGDTs, and thus unequal loads from overheating or even destroying the individual IGDTs. Likewise in the switched-off state, in which unequal reverse currents would result in different voltage drops across individual IGDTs, which would in turn lead to enormous loads through to the destruction of individual IGDTs. Reverse currents can be reduced by the anodal gate of the IGDT by up to 50% compared with conventional IGCTs. The method according to the invention thus enables turn-off power semiconductors to be connected in series, without parallel-connected resistors.

In addition, the use of the IGDT in parallel circuits is made possible by the fact that, in the switch-on operation of the IGDT, the rate of rise of the anode current is limited via the two gates.

By limiting the reverse current between anode and cathode through both gates in the switched-off state, the IGDT can be operated with a higher depletion layer temperature, thereby enlarging the safe operating area (SOA) of the IGDT.

The improved thermal budget which can be complied with by virtue of the abovementioned advantages allows the IGDT to operate with up to 100% higher switching frequencies in comparison with conventional IGCTs.

In contrast to conventional dual gate GTOs, with the IGDT the gate current of one of the gates can be controlled during the turn-off. It is thus possible to prevent dangerous voltage spikes as occur, for instance, when currents suddenly cut off (snap off) in diodes or dual gate semiconductors.

Further advantageous embodiments emerge from the totality of the dependent claims.

BRIEF DESCRIPTION OF THE DRAWINGS

In order to provide a better understanding and in order to illustrate the advantages obtained, the invention will be explained in more detail below with reference to the drawings.

DETAILED DESCRIPTION OF THE INVENTION

In all the figures, identical reference symbols relate to identically acting parts.

The integrated gate dual transistor IDGT has a four-layer semiconductor substrate which is provided with in each case two electrical terminals on both sides.

Figure 1:
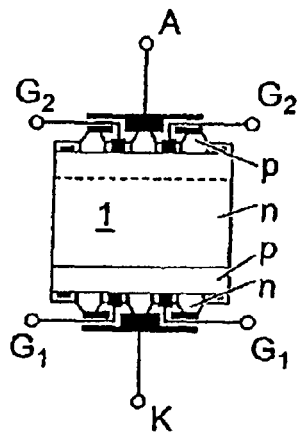
FIG. 1 diagrammatically shows a sectional view of an integrated gate dual transistor IGDT, with a cathodal first gate and an anodal second gate.

FIG. 1 diagrammatically shows a sectional view of the IDGT with the four differently doped semiconductor layers,
an anodal outer p-doped anode layer,
a two-part, n-doped base layer with integrated n-type buffer,
a p-doped base layer and also
a cathodal outer n-doped cathode layer.

On both sides the IDGT respectively has a main terminal, anode A and cathode K, and also a gate terminal, the first gate GI on the cathode side and the second gate $G_2$ on the anode side.

Figure 2:
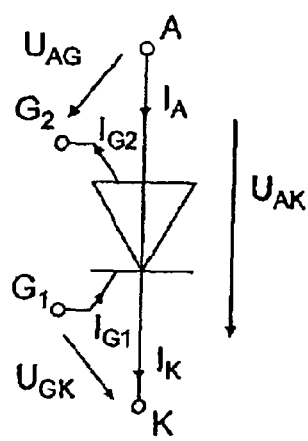
FIG. 2 shows a circuit symbol for the IGDT of FIG. 1.

FIG. 2 shows a symbol of the IGDTs. In this description, positive values in the arrow direction in accordance with this illustration are used for the voltages and the currents.

Figure 3:
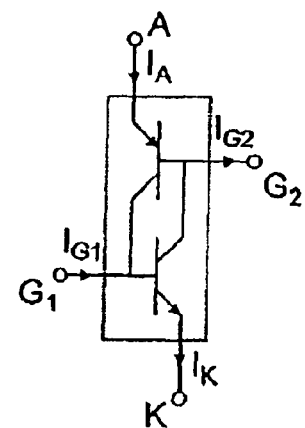
FIG. 3 shows an equivalent circuit diagram of the IGDT of FIG. 1.

FIG. 3 shows an equivalent circuit diagram of the IGDT with an anodal pnp transistor and a cathodal npn transistor.

As indicated in FIG. 1, the two gate terminals are formed in a rotationally symmetrical manner and led through the main terminals from the housing of the IGDTs. This results in low-inductance terminals with an internal inductance of less than 100 nH (measured between anode and second gate terminal $G_2$ or cathode and first gate terminal $G_1$ with a metal disk instead of the semiconductor substrate).

Figure 4:
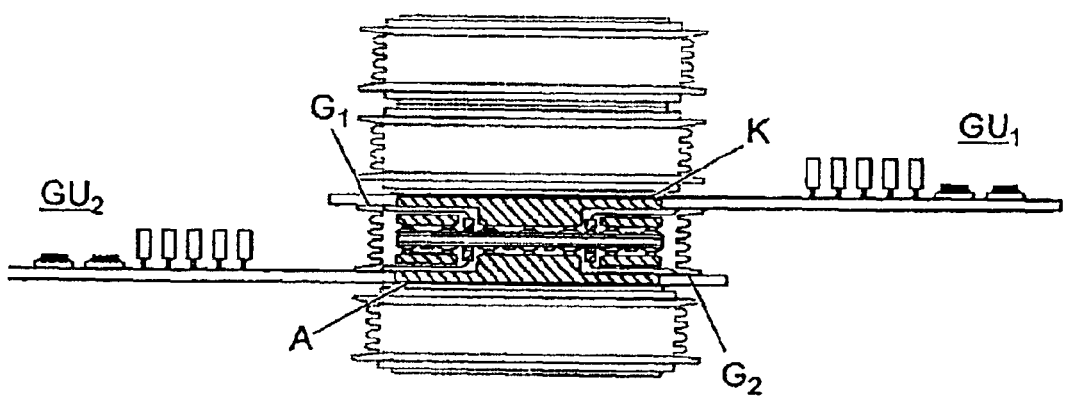
FIG. 4 shows the IGDT of FIG. 1 with a cathodal gate driver and an anodal gate driver in a stack of four series-connected IGDTs.

FIG. 4 shows an IGDT with housing and gate driver units $GU_1$ and $GU_2$ connected on both sides in a stack of four series-connected IGDTs. As represented, the gate driver units are arranged on a printed circuit board provided with a metallization layer on both sides. On the anode side, for example, one metallization layer, facing the IGDT, is connected to the second gate terminal $G_2$. The other metallization layer is connected to the anode terminal. To that end, the printed circuit board and the gate metallization layer are removed in the region of the anode terminal, so that the anode terminal makes contact with the metallization layer through a hole in the printed circuit board.

Between the two gate terminals $G_1$ and $G_2$ brought out of the housing there is an isolation clearance which withstands at least the maximum operating voltage of the IGDT.

The IGDT is in the blocking state when no current which would lead to a continual increase in the semiconductor temperature and ultimately to the destruction of the semiconductor flows at the maximum permissible anode-cathode voltage between anode and cathode.

The IDGT is in the conducting state when the anode-cathode conductivity is so great that the maximum permissible anode-cathode current would not lead to a continual increase in the semiconductor temperature and ultimately to destruction of the semiconductor.

The IGDT can be put into a conducting state between anode and cathode by means of a positive triggering current at one of the two gate terminals.

During suitable operation, the IGDT allows a high rate of rise of the anode current, greater than 20 $A/\mu s/cm_{si}^2$, during the transition from the blocking to the conducting state.

At a sufficiently large current (a few percent of the maximum permissible current) between anode and cathode, the component retains its conducting state even without a gate current.

The IGDT can be put into the blocking state from the conducting state by application of a sufficiently large negative gate current at one of the gate terminals or at both simultaneously.

Depending on the gate driver, very high rates of change of the anode current can be achieved during the transition from the conducting to the blocking state. Moreover, the IGDT allows a high rate of rise of the voltage between anode and cathode (greater than 1 kV/$\mu s$).

During the transition from the conducting to the blocking state, operation without a snubber circuit is possible for the IGDT by virtue of the gates driven in a low-inductance manner on both sides.

In order to put the IGDT into the conducting or blocking state, both or only one of the two gates can be operated by a control circuit unit. In this case, different signals are permitted to be passed to the two gate terminals.

The gate driver unit must be designed such that the gate currents required for operating both gates can be generated with a rate of rise of more than 20 A/$\mu$s/cm$_{si}^2$. The two gate currents must be able to be generated simultaneously or temporally staggered.

The IGDT turns off very rapidly as a result of the application of a very rapidly rising gate current to the anodal gate, the cathodal gate or, simultaneously or temporally staggered, to both gates. In particular during the turn-off driven on both sides, the tail current that is present in the conventional GCT practically completely disappears, since charge carriers are rapidly removed from within the IGDT via the gates driven on both sides. Switching losses are drastically reduced as a result. Compared with the conventional dual date GTO, it should be taken into consideration here that the gates of the IGDT can be driven independently of the present operating state, and that in particular no, or a very small, temporal delay of 0–10 $\mu$s, in particular 0–6 $\mu$s, is necessary between the first and second gate currents in order to cause the tail current to totally disappear. The very steeply rising gate currents can thus be fed practically synchronously into the gate terminals.

The rapidly falling anode current together with the disappearance of the tail current entails a considerable reduction of the dynamic switching losses.

Figure 10:
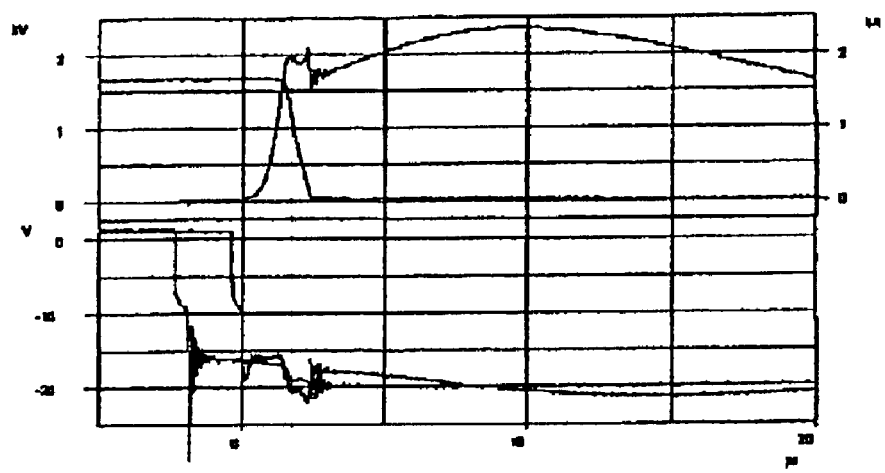
FIG. 10 shows a diagram of an IDGT in the switch-off phase during accelerated switching-off without a residual current.

FIG. 10 illustrates the rapid turn-off of the IGDT using the temporal profile of the anode current $I_A$ and the anode-cathode voltage $U_{AK}$ during turn-off with voltages that are different and temporally staggered by 2 $\mu$s at the two gates $G_1$ and $G_2$. In the upper diagram, anode current $I_A$ and anode-cathode voltage $U_{AK}$ are plotted against time, and in the lower diagram the two gate voltages.

Figure 12:
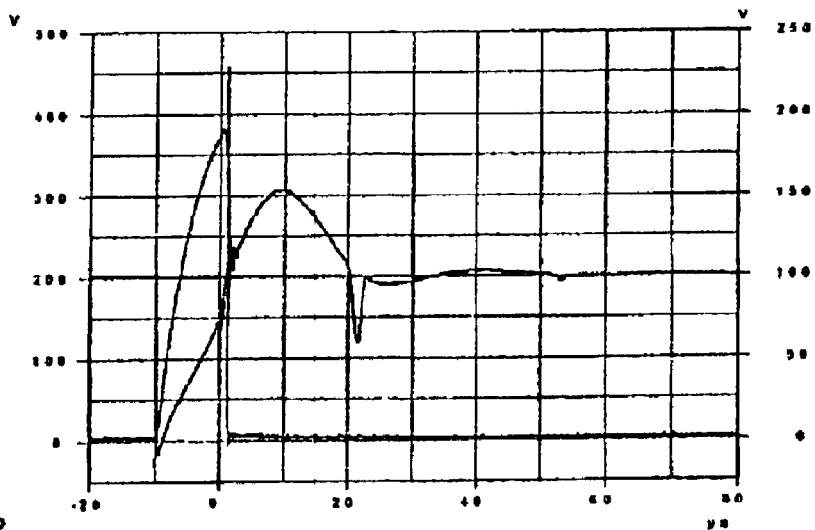
FIG. 12 shows a diagram of an IDGT in the switch-off phase during limiting of the rate of rise of the anode current.
Figure 13:
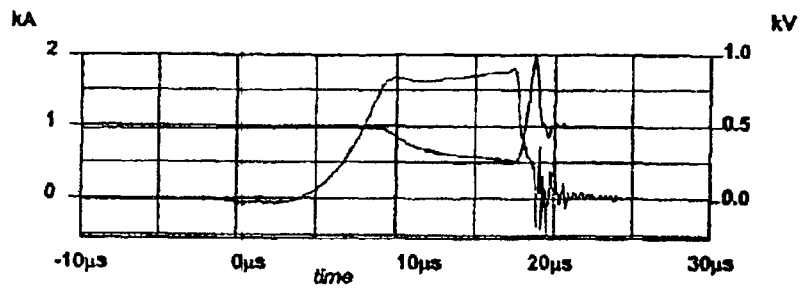
FIG. 13 shows a diagram of an IDGT in the conducting state during limiting of the anode current.
Figure 14:
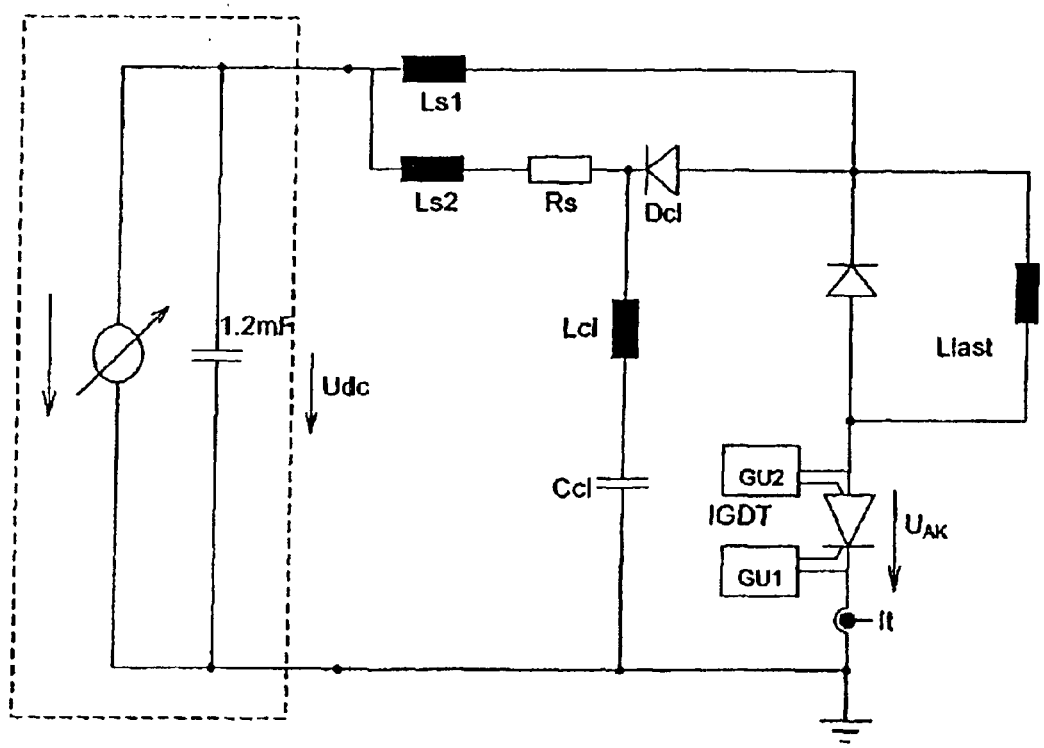
FIG. 14 shows a circuit for testing the IDGT.

The curves illustrated in FIGS. 10 to 13 were measured in a test arrangement in accordance with FIG. 14.

What should be emphasized especially is the improved possibility of using the IGDT as turn-off power semiconductor element in series and/or parallel circuits. In this case it should be ensured that the loading of the series-connected components lies in the safe operating area in order not to adversely affect the lifetime of the components.

By way of example, the rate of change of the anode-cathode voltage is to be limited during switching-on and -off of the component, in order that a uniform voltage distribution over all the components can be achieved in the series circuit.

Alternatively, the reverse current is to be controlled (increased or decreased) in the switched-off state, in order that a uniform voltage distribution over all the components can again be achieved for the series circuit.

Alternatively, the rate of change of the anode current is to be limited during switching-on and -off of the component, in order that a uniform current distribution over all the components can be achieved in the parallel circuit.

The rate of rise of the anode-cathode voltage can be limited in the switch-off operation in three different ways:

1. By driving only the anodal gate with a greatly rising gate current $I_{G2}$.

Figure 11:
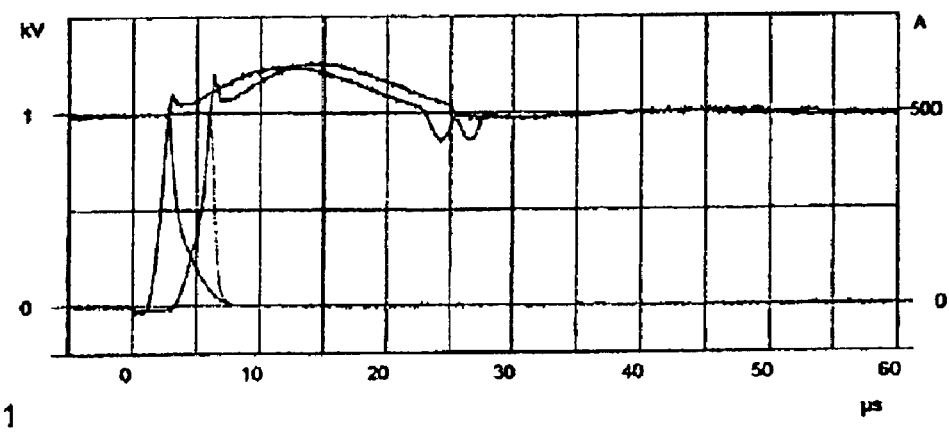
FIG. 11 shows a diagram of an IDGT in the switch-off phase during limiting of the rate of rise of the anode-cathode voltage.

FIG. 11 shows a comparison between an IGDT turned off on the cathode side and one turned off on the anode side. In the case of the IGDT turned off on the cathode side, the anode current $I_A$ falls greatly after 2.5 $\mu$s, while the anode-cathode voltage $U_{AK}$ rises steeply between zero 2.5 $\mu$s. In the case of the IGDT turned off on the anode side, the anode current falls steeply only after 6 $\mu$s, and the anode-cathode voltage $U_{AK}$ builds up correspondingly longer and more gradually.

Figure 8:
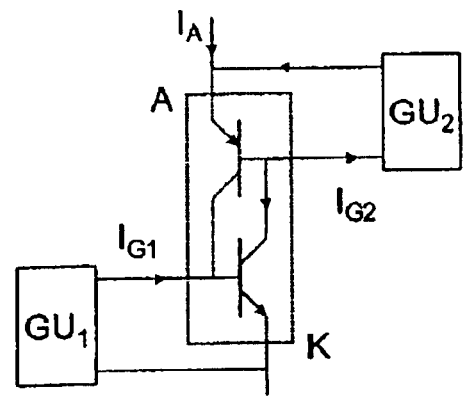
FIG. 8 shows an example of the equivalent circuit diagram of an IGDT during a current-controlled switch-off operation.

By bringing the anode current $I_A$ to zero with a greatly rising and sufficiently large gate current $I_{G2}$ and then reducing the cathodal gate current $I_{G1}$ uniformly back to zero from its maximum value. In this case, it can be seen from the equivalent circuit diagram in FIG. 8 that the anodal transistor is short-circuited via the gate driver. The cathode current $I_K$ is uniformly reduced by the cathodal transistor by the gate current $I_{G1}$ correspondingly being uniformly reduced back to zero.

3. By bringing the cathode current to zero with a greatly rising and sufficiently large gate current $I_{G1}$, and then reducing the anodal gate current $I_{G2}$ uniformly back to zero from its maximum value. In this case, it can be seen from the equivalent circuit diagram that the cathodal transistor is short-circuited via the gate driver. The anode current is uniformly reduced by the anodal transistor by the gate current $I_{G2}$ correspondingly being uniformly reduced back to zero.

Figure 9:
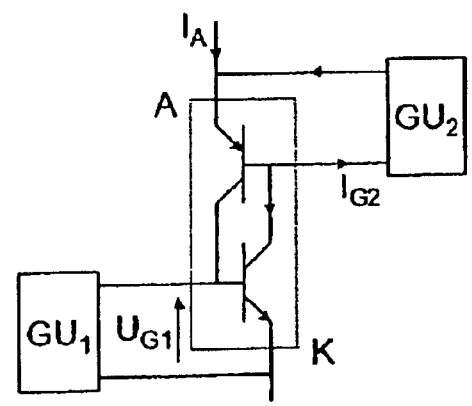
FIG. 9 shows an equivalent circuit diagram of an IGDT in the switched-off state.

In order to control the reverse current in the switched-off state, as shown in FIG. 9, a negative gate voltage $U_{GK}$ is applied to the cathodal first gate $G_1$. The reverse current is increased by application of a small positive gate current $I_{G2}$ to the anodal gate. The positive gate current is linearly amplified (approximately 1:1) by the internal semiconductor (pnp transistor), as a result of which the reverse current increases. A reduction of the reverse current results from a negative gate voltage at the anodal gate $U_{AG}$. By virtue of this driving according to the invention of at least two series-connected IGDTs it is possible to omit the static parallel resistors (sharing resistors) for equalizing unequal voltage distributions over the components.

The rate of rise of the anode current can be limited in the switch-on operation by applying a negative gate voltage to one of the two gates and connecting the other gate to a positive gate current. The profile of the anode current is consequently dependent on the load, on the profile of the gate current and also on the design of the semiconductor. A corresponding example is illustrated in FIG. 12. In the region of −10 to 0 $\mu$s, a negative gate voltage $U_{AG}$=−20 V is applied to the second gate $G_2$ and a positive gate current of $I_{G1}$>50 A is fed in at the first gate $G_1$. In contrast to the IGCT, the IGDT does not trigger in this case, but rather allows the anode current $I_A$ to be controlled via the positive gate current $I_{G1}$. A typical gain factor is 500 in this case.

The IGDT can be brought both from the switched-on and from the switched-off state into a current-guided state. In this case, the anode current is determined directly by the gate currents. For this purpose, the anodal second gate $G_2$ is switched off (the anode current $I_A$ is "diverted" with a sufficiently large negative gate current $I_{G2}$), so that a load current controlled by the cathodal first gate current $I_{G1}$ is established on the cathode side. In this way, it is possible to prevent or rapidly reduce an anode overcurrent in the switched-on state or an anode-cathode overvoltage in the switch-off operation.

FIG. 13 shows a corresponding example. At time 0 $\mu$s the second gate $G_2$ is switched off while the first gate $G_1$ continues to be driven by 10 A. On the anode side, the gate voltage $U_{AG}$ rises within 10 $\mu$s to its maximum value (approximately 800–900 V), while the anode current $I_A$ falls to a load-independent value (500 A). After 18 μs, the second gate $G_2$ is switched on again.

Figure 6:
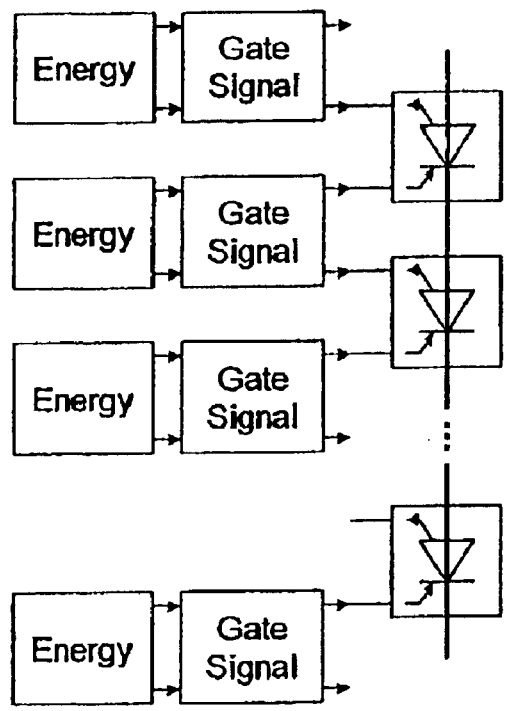
FIGS. 5 to 7 show different embodiments of gate drivers for series-connected IGDTs.
Figure 5:
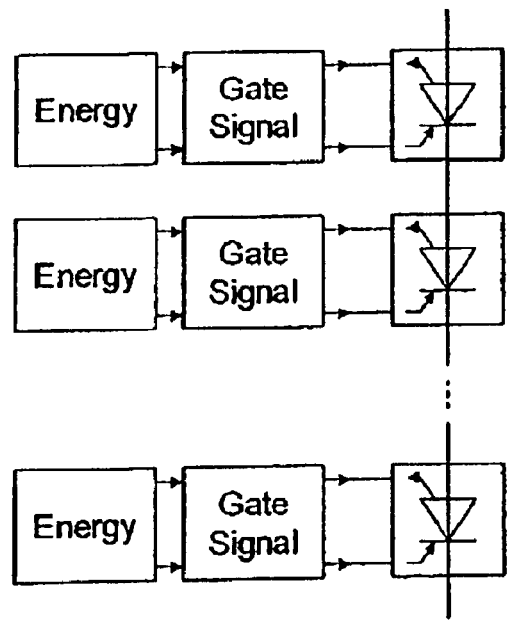
Figure 7:
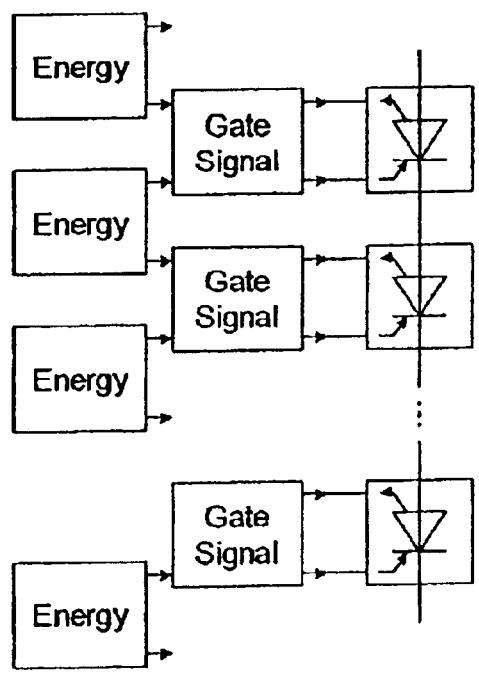

FIGS. 5 to 7 show various possibilities of how the gate terminals for a plurality of series-connected IGDTs can be arranged and supplied with energy. The advantage of the arrangements illustrated resides in the minimization of the costs for driving the series-connected components.

A gate driver in each case comprises two gate driver units which are in turn fed separately or jointly by an energy supply unit.

FIG. 5 shows a first arrangement, in which the two gate driver units each drive the first gate $G_1$ and the second gate $G_2$ of an IGDT. The energy supplies of the two driver units are coupled. The total energy is drawn either from an external circuit or from the anode-cathode voltage of the driven IGDT. In this way, only n gate drivers are required for n IGDTS.

FIG. 6 shows a second arrangement, in which a gate driver drives the two adjacent gates—at the same potential—of two series-connected IGDTs. The energy supplies for controlling the two gates are directly coupled to one another and again form a unit. In this way, n+1 gate drivers are required for n IGDTs.

Finally, FIG. 7 shows a third arrangement in which a gate driver again drives the two adjacent gates of two series-connected IGDTs. However, the energy supplies are embodied in accordance with the first arrangement, whereby each IGDT has a dedicated energy supply for its two gates.

LIST OF REFERENCE SYMBOLS

| | |
|---|---|
| 1 | Semiconductor substrate |
| A | Anode |
| $G_1, G_2$ | Gate |
| $GU_1, GU_2$ | Gate driver units |
| $I_A, I_K$ | Anode current, cathode current |
| $I_{G1}, I_{G2}$ | Gate current |
| K | Cathode |
| $U_{AG}, U_{GK}$ | Gate voltage |
| $U_{AK}$ | Anode-cathode voltage |

What is claimed is:

1. A circuit arrangement comprising:
    a series circuit of IGDTs, each IGDT including between an anode and a cathode a four-layer semiconductor substrate, the substrate having an anodal outer p-doped anode layer, a two-part, n-doped base layer with integrated n-type buffer, a p-doped base layer and a cathodal outer n-doped cathode layer, each IGDT including two gates controllable via low-inductance gate terminals, a first a first one of the two gates being provided on the cathode side, and a second one of the two gates being provided on the anode side,
    a plurality of gate drivers comprising two control units for driving respective gates, each gate driver being configured to generate gate currents with a rate of rise greater than 20 amperes/microsecond/$cm_{si}^2$, and
    a plurality of units for supplying energy to the gate drivers, wherein
    a first one of the control units of a first one of the gate drivers drives the first gate of a first one of the IGDTs, and
    a second one of the control units of the first one of the gate drivers drives the second gate of a second one of the IGDTs connected to the cathode of the first one of the IGDTs on the anode side.

2. The circuit arrangement as claimed in claim 1, wherein each energy supply unit supplies both control units of one of the gate drivers with energy.

3. The circuit arrangement as claimed in claim 1, wherein one of the energy supply units supplies a second control unit of a first one of the gate drivers and/or a first control unit of a second one of the gate drivers with energy.

4. A circuit arrangement comprising:
    a series circuit of IGDTs, each IGDT including between an anode and a cathode a four-layer semiconductor substrate, the substrate having an anodal outer p-doped anode layer, a two-part, n-doped base layer with integrated n-type buffer, a p-doped base layer and a cathodal outer n-doped cathode layer, each IGDT including two gates controllable via low-inductance gate terminals, a first one of the two gates being provided on the cathode side, and a second one of the two gates being provided on the anode side,
    a plurality of gate drivers each comprising two control units for driving respective gates, each gate driver being configured to generate gate currents with a rate of rise greater than 20 amperes/microsecond/$cm_{si}^2$, and
    units for supplying energy to the gate drivers, wherein
    for each gate driver, the two control units of the gate driver drive the two gates of one of the IGDTs.

5. The circuit arrangement as claimed in claim 4, wherein each energy supply unit supplies both control units of one of the gate drivers with energy.

6. The circuit arrangement as claimed in claim 4, wherein one of the energy supply units supplies a second control unit of a first one of the gate drivers and/or a first control unit of a second one of the gate drivers with energy.

7. A method for driving a power semiconductor element, the power semiconductor element being an integrated gate dual transistor (IGDT) comprising between an anode and a cathode a four-layer semiconductor substrate, having an anodal outer p-doped anode layer, a two-part, n-doped base layer with integrated n-type buffer, a p-doped base layer and a cathodal outer n-doped cathode layer, and two gates controllable via low-inductance gate terminals, the method comprising:
    in the switch-off operation of the IGDT, reducing the switching losses via the two gates by building up the second gate current with a rate of rise of more than 20 A/μs/$cm_{si}^2$ in the initial phase of the switch-off operation, and building up the first gate current with a rate of rise of more than 20 A/μs/$cm_{si}^2$ up to 6 μs after the second gate current.

8. A method for driving a power semiconductor element, the power semiconductor element being an integrated gate dual transistor (IGDT) comprising between an anode and a cathode a four-layer semiconductor substrate, having an anodal outer p-doped anode layer, a two-part, n-doped base layer with integrated n-type buffer, a p-doped base layer and a cathodal outer n-doped cathode layer, and two gates controllable via low-inductance gate terminals, the method comprising:
    in the switch-off operation of the IGDT, limiting the rate of rise of the anode voltage across the IGDT by either bringing the cathode current to zero by means of a first gate current rising with a rate of rise of more than 20 A/μs/$cm_{si}^2$, and subsequently reducing the second gate current back to zero from its maximum value, or bringing the anode current to zero by means of a second gate current rising with a rate of rise of more than 20 A/μs/cm$_{si}^2$, and subsequently reducing the first gate current back to zero from its maximum value.

9. A method for driving a power semiconductor element, the power semiconductor element being an integrated gate dual transistor (IGDT) comprising between an anode and a cathode a four-layer semiconductor substrate, having an anodal outer p-doped anode layer, a two-part, n-doped base layer with integrated n-type buffer, a p-doped base layer and a cathodal outer n-doped cathode layer, and two gates controllable via low-inductance gate terminals, the method comprising:

in the switched-off state of the IGDT, controlling the reverse current between anode and cathode by applying a negative voltage to the first gate, applying a positive second gate current to the second gate in order to increase the reverse current, and applying a negative voltage to the second gate in order to decrease the reverse current.

10. A method for driving a power semiconductor element, the power semiconductor element being an integrated gate dual transistor (IDGT) comprising between an anode and a cathode a four-layer semiconductor substrate, having an anodal outer p-doped anode layer, a two-part, n-doped base layer with integrated n-type buffer, a p-doped base layer and a cathodal outer n-doped cathode layer, and two gates controllable via low-inductance gate terminals, the method comprising:

in the switch-on operation of the IGDT, limiting the rate of rise of the anode current by applying a continuous negative gate voltage to the first gate, and controlling the buildup of the anode current via a positive gate current at the second gate or applying a continuous negative gate voltage to the second gate, and controlling the buildup of the anode current via a positive gate current at the first gate.

11. A method for driving a power semiconductor element, the power semiconductor element being an integrated gate dual transistor (IGDT) comprising between an anode and a cathode a four-layer semiconductor substrate, having an anodal outer p-doped anode layer, a two-part, n-doped base layer with integrated n-type buffer, a p-doped base layer and a cathodal outer n-doped cathode layer, and two gates controllable via low-inductance gate terminals, the method comprising:

in the switched-on state of the IGDT, limiting the anode current by either switching off the first gate with a negative gate current with a rate of rise of more than 20 A/μs/cm$_{si}^2$, and controlling the anode current via a positive gate current at the second gate, or switching off the second gate with a negative gate current with a rate of rise of more than 20 A/μs/cm$_{si}^2$, and controlling the anode current via a positive gate current at the first gate.

* * * * *